United States Patent
Parker, IV

(10) Patent No.: US 11,543,322 B2
(45) Date of Patent: Jan. 3, 2023

(54) CRACK IDENTIFICATION IN IC CHIP PACKAGE USING ENCAPSULATED LIQUID PENETRANT CONTRAST AGENT

(71) Applicant: GLOBALFOUNDRIES U.S. Inc., Santa Clara, CA (US)

(72) Inventor: George K. Parker, IV, Morrisville, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 71 days.

(21) Appl. No.: 16/864,536

(22) Filed: May 1, 2020

(65) Prior Publication Data

US 2021/0341349 A1    Nov. 4, 2021

(51) Int. Cl.
| | |
|---|---|
| G01M 3/22 | (2006.01) |
| H01L 21/54 | (2006.01) |
| H01L 23/22 | (2006.01) |
| H01L 23/26 | (2006.01) |
| H01L 21/56 | (2006.01) |

(52) U.S. Cl.
CPC ............ *G01M 3/226* (2013.01); *H01L 21/54* (2013.01); *H01L 21/563* (2013.01); *H01L 23/22* (2013.01); *H01L 23/26* (2013.01)

(58) Field of Classification Search
None
See application file for complete search history.

(56) References Cited

U.S. PATENT DOCUMENTS

| | | | | |
|---|---|---|---|---|
| 4,172,224 A | * | 10/1979 | Lapinski | G01N 23/083 250/302 |
| 4,819,256 A | * | 4/1989 | Annis | G01N 23/18 378/87 |
| 4,955,740 A | | 9/1990 | Renz et al. | |
| 5,561,173 A | * | 10/1996 | Dry | A61L 27/48 428/320.2 |
| 5,660,624 A | * | 8/1997 | Dry | A61L 27/48 106/676 |
| 5,891,754 A | | 4/1999 | Bowles et al. | |

(Continued)

OTHER PUBLICATIONS

Autonomic healing of polymer composites, white et al., 5 pp, retrieved from internet on Sep. 27, 2021: https://www.nature.com/articles/35057232 (Year: 2001).*

(Continued)

*Primary Examiner* — Bo B Jang
(74) *Attorney, Agent, or Firm* — Anthony Canale; Hoffman Warnick LLC

(57) ABSTRACT

A packaging fill material for electrical packaging includes a base material, and a plurality of frangible capsules distributed in the base material. Each frangible capsule includes a liquid penetrant contrast agent therein having a different radiopacity than the base material. In response to a crack forming in the packaging fill material, at least one of the plurality of frangible capsules opens, releasing the liquid penetrant contrast agent into the crack. Cracks can be more readily identified in an IC package including the packaging fill material. The liquid penetrant contrast agent may have a radiopacity that is higher than the base material. Inspection can be carried out using electromagnetic analysis using visual inspection or digital analysis of the results to more easily identify cracks.

14 Claims, 3 Drawing Sheets

(56) References Cited

U.S. PATENT DOCUMENTS

| | | | |
|---|---|---|---|
| 5,982,631 A | 11/1999 | Bowles et al. | |
| 6,001,333 A | 12/1999 | See | |
| 6,518,330 B2* | 2/2003 | White | C09D 7/65 523/200 |
| 6,527,849 B2* | 3/2003 | Dry | B32B 5/02 106/677 |
| 6,858,660 B1* | 2/2005 | Scheifers | C09J 4/00 428/402.21 |
| 6,876,143 B2* | 4/2005 | Daniels | H01L 51/50 313/504 |
| 7,045,562 B2* | 5/2006 | Thiel | H01L 23/293 523/205 |
| 7,108,914 B2* | 9/2006 | Skipor | B01J 13/02 257/E21.505 |
| 7,186,761 B2* | 3/2007 | Soffiati | A61L 24/001 433/228.1 |
| 7,566,747 B2* | 7/2009 | Moore | B29C 73/22 523/205 |
| 7,569,625 B2* | 8/2009 | Keller | B29C 73/163 427/387 |
| 7,612,152 B2* | 11/2009 | Braun | B29C 73/22 525/476 |
| 7,723,405 B2* | 5/2010 | Braun | C09D 7/68 523/212 |
| 7,790,814 B2 | 9/2010 | Basheer et al. | |
| 7,972,905 B2* | 7/2011 | Wainerdi | H01L 24/32 438/119 |
| 8,063,307 B2* | 11/2011 | Bukshpun | A41D 1/005 174/102 SC |
| 8,080,318 B2* | 12/2011 | De Jong | G03G 15/2057 428/421 |
| 8,383,697 B2* | 2/2013 | Wilson | A61L 27/50 523/120 |
| 8,846,404 B2* | 9/2014 | Odom | G01N 21/78 436/2 |
| 8,865,798 B2* | 10/2014 | Merle | B01J 13/18 523/206 |
| 8,987,352 B1* | 3/2015 | Ou | C08L 67/04 523/215 |
| 8,993,066 B2* | 3/2015 | Yang | C09D 7/70 427/386 |
| 9,108,364 B2* | 8/2015 | Caruso | B29C 73/22 |
| 9,230,921 B2* | 1/2016 | Ayotte | H01L 23/585 |
| 9,678,022 B2* | 6/2017 | Bowman | G01N 23/04 |
| 9,752,065 B2* | 9/2017 | Ahn | C09J 163/00 |
| 9,831,211 B2* | 11/2017 | Chu | H01L 24/29 |
| 9,931,281 B2* | 4/2018 | Sun | A61K 6/77 |
| 9,947,899 B2* | 4/2018 | Liu | H01L 51/5259 |
| 10,174,221 B2* | 1/2019 | Sottos | C09D 7/65 |
| 10,179,846 B1* | 1/2019 | Crall | C08K 9/06 |
| 10,338,031 B2* | 7/2019 | Tago | H05K 1/0218 |
| 10,370,305 B1* | 8/2019 | Taha | C04B 41/4961 |
| 10,508,204 B2* | 12/2019 | Odarczenko | C09D 163/00 |
| 10,570,307 B2* | 2/2020 | Lalgudi | C09D 133/06 |
| 10,643,914 B2* | 5/2020 | Takematsu | H01L 23/3135 |
| 10,797,013 B2* | 10/2020 | Jin | C08K 5/5435 |
| 10,830,544 B2* | 11/2020 | Joshi | C23C 16/06 |
| 10,933,625 B2* | 3/2021 | Fisher | B41F 17/001 |
| 2001/0050032 A1* | 12/2001 | Dry | C04B 35/80 106/677 |
| 2002/0111434 A1* | 8/2002 | White | C09D 7/65 525/242 |
| 2004/0007784 A1* | 1/2004 | Skipor | B29C 73/22 257/788 |
| 2004/0113543 A1* | 6/2004 | Daniels | H01L 27/32 313/504 |
| 2004/0157952 A1* | 8/2004 | Soffiati | A61L 24/0089 523/115 |
| 2005/0025881 A1* | 2/2005 | Daniels | H05B 33/00 427/66 |
| 2005/0027078 A1* | 2/2005 | Scheifers | H05K 3/225 525/242 |
| 2005/0085564 A1* | 4/2005 | Thiel | H01L 21/563 523/206 |
| 2005/0250878 A1* | 11/2005 | Moore | B29C 73/22 523/211 |
| 2006/0169180 A1* | 8/2006 | Dry | B32B 15/14 106/711 |
| 2006/0252852 A1* | 11/2006 | Braun | C08F 291/00 523/200 |
| 2007/0029653 A1* | 2/2007 | Lehman | H01L 24/29 257/678 |
| 2007/0166542 A1* | 7/2007 | Braun | C08L 101/00 428/402.21 |
| 2007/0282059 A1* | 12/2007 | Keller | B29C 73/163 524/588 |
| 2008/0047472 A1* | 2/2008 | Dry | C04B 20/0056 106/641 |
| 2008/0050612 A1* | 2/2008 | Dry | C04B 35/80 428/689 |
| 2008/0053338 A1* | 3/2008 | Dry | A61L 27/48 106/642 |
| 2008/0057296 A1* | 3/2008 | Dry | C04B 20/0056 428/320.2 |
| 2008/0058445 A1* | 3/2008 | Dry | A61L 27/48 523/206 |
| 2008/0107888 A1* | 5/2008 | Dry | B32B 15/14 428/313.3 |
| 2008/0237822 A1* | 10/2008 | Raravikar | H01L 23/295 257/684 |
| 2008/0299391 A1* | 12/2008 | White | B01J 13/14 428/402.21 |
| 2009/0015272 A1* | 1/2009 | Jones | C08K 7/04 324/693 |
| 2009/0036568 A1* | 2/2009 | Merle | B01J 13/18 523/206 |
| 2009/0226228 A1* | 9/2009 | De Jong | G03G 15/2057 399/333 |
| 2009/0304909 A1* | 12/2009 | Daniels | H01L 27/14627 427/66 |
| 2010/0122832 A1* | 5/2010 | Bukshpun | A41D 1/005 174/11 OR |
| 2010/0264553 A1* | 10/2010 | Wainerdi | H01L 24/32 257/783 |
| 2010/0308276 A1* | 12/2010 | Dry | B32B 9/04 252/502 |
| 2010/0331445 A1* | 12/2010 | Wilson | A61L 27/50 523/116 |
| 2011/0039980 A1* | 2/2011 | Caruso | B29C 73/163 523/400 |
| 2011/0271856 A1* | 11/2011 | Fisher | B41F 17/001 101/333 |
| 2012/0196373 A1* | 8/2012 | Odom | G01N 21/78 436/2 |
| 2013/0196071 A1* | 8/2013 | Yang | C08G 18/703 427/386 |
| 2014/0024765 A1* | 1/2014 | Nunoshige | H01B 3/448 524/549 |
| 2014/0144427 A1* | 5/2014 | Numrich | H01L 31/0543 126/684 |
| 2015/0097271 A1* | 4/2015 | Ayotte | H01L 21/3105 257/620 |
| 2015/0184041 A1* | 7/2015 | Ahn | C09J 163/10 428/413 |
| 2016/0069824 A1* | 3/2016 | Bowman | G01N 23/04 378/163 |
| 2016/0193119 A1* | 7/2016 | Sun | A61K 6/54 523/116 |
| 2016/0289484 A1* | 10/2016 | Lalgudi | B29C 73/163 |
| 2017/0053847 A1* | 2/2017 | Takematsu | H01L 23/562 |
| 2017/0062374 A1* | 3/2017 | Chu | H01L 24/29 |
| 2017/0092897 A1* | 3/2017 | Liu | H01L 51/5256 |
| 2017/0100902 A1* | 4/2017 | Asmatulu | B01J 13/14 |
| 2017/0158883 A1* | 6/2017 | Sottos | C09D 7/41 |
| 2017/0158886 A1* | 6/2017 | Odarczenko | C09D 163/00 |
| 2017/0176392 A1* | 6/2017 | Tago | H01L 23/5384 |
| 2018/0247910 A1* | 8/2018 | Jin | C08K 3/22 |
| 2018/0326454 A1* | 11/2018 | Khoshkava | B06B 1/0603 |

(56) References Cited

U.S. PATENT DOCUMENTS

2018/0342693 A1* 11/2018 Sato .................... H01L 51/0097
2019/0330499 A1* 10/2019 Rodriguez Alonso .......................
                                                      B01J 13/185
2020/0132400 A1*  4/2020 Joshi ....................... F28F 19/06
2020/0294886 A1*  9/2020 Saha ....................... H01L 24/09
2021/0197546 A1*  7/2021 Fisher .................. B41F 17/001

OTHER PUBLICATIONS

Effects of Self-healing Microcapsules on Dental Resin Composites, Althaqafi, 215 pp, retrieved from internet on Sep. 27, 2021 https://www.research.manchester.ac.uk/portal/files/194691315/FULL_TEXT.PDF (Year: 2019).*

* cited by examiner

CRACK IDENTIFICATION IN IC CHIP PACKAGE USING ENCAPSULATED LIQUID PENETRANT CONTRAST AGENT

BACKGROUND

The present disclosure relates to integrated circuit (IC) chip package fabrication, and more specifically, to structures and methods for identifying cracks in packaging fill material (underfill and/or overmold) using an encapsulated liquid penetrant contrast agent.

An integrated circuit (IC) chip package couples one or more IC chips to a substrate that allows scaling of the circuitry. The IC chip(s) may be electrically coupled to circuitry in the substrate using any of a variety of electrical solder connections such as a ball grid array (BGA). An underfill material is positioned between the IC chip and the substrate and surrounding the solder connections to provide additional support between the IC chip and the substrate. The underfill material may include a plastic such as a glass/silica/alumina bead or particle filled epoxy.

Cracks in the underfill material can jeopardize the integrity of the IC chip package, and in some cases, may lead to failures. The cracks can be created and/or enlarged by thermal cycling during assembly or during use. In order to detect cracks, the IC chip packages may be inspected using non-invasive, electromagnetic techniques such as X-ray tomography. The difference in radiopacity of the gas in the cracks and the underfill material ideally makes the cracks visible using the results of the electromagnetic analysis. However, it is very difficult to detect small cracks in low-contrast IC chip packaging underfill materials, e.g., plastics. Current approaches to improve crack detectability include improvements to the X-ray systems or data analysis. Other approaches increase the radiopacity of the underfill materials, making the gas filled voids of the cracks more readily recognizable using X-ray tomography compared to the adjacent un-cracked underfill material. In this approach, the underfill material chemistry is typically modified, e.g., by incorporating a radiopaque isotope therein that increases contrast of the base underfill material adjacent a gas-filled crack. Despite the increased radiopacity of the underfill materials, the gas-filled voids created by small cracks are still very difficult to identify in the underfill materials. Overmolded chip packages suffer from similar issues with the overmold material.

SUMMARY

Aspects of the disclosure are directed to an integrated circuit (IC) chip package, comprising: a substrate; a IC chip operatively positioned on the substrate; a plurality of solder connections electrically coupling the IC chip to the substrate; and a packaging fill material surrounding the solder connections, the packing fill material including a base material having a plurality of frangible capsules distributed therein, each frangible capsule having a liquid penetrant contrast agent therein having a different radiopacity than the base material.

Another aspect of the disclosure includes a method, comprising: establishing a coupling of an integrated circuit (IC) chip to a substrate including a plurality of wires using a plurality of solder connections; and filling a space adjacent the IC chip with a packaging fill material, the packaging fill material including base material having a plurality of frangible capsules distributed therein, each frangible capsule including a liquid penetrant contrast agent therein having a different radiopacity than the base material.

A further aspect of the disclosure related to a packaging fill material for electrical packaging, the packaging fill material comprising: a base material; and a plurality of frangible capsules distributed in the base material, each frangible capsule including a liquid penetrant contrast agent therein having a different radiopacity than the base material.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
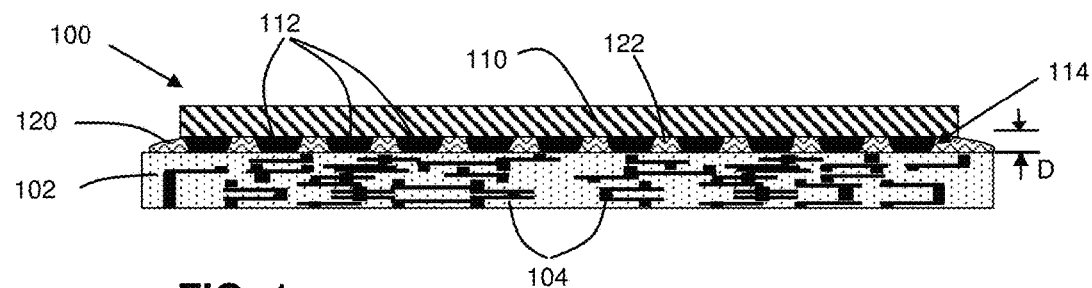
FIG. 1 shows a cross-sectional view of an integrated circuit (IC) chip package including a packaging fill material in the form of an underfill material, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide methods and structure for identifying cracks in a packaging fill material for electrical packaging. The packaging fill material may include underfill or overmold material that surrounds electrical connections such as solder balls or controlled collapse chip connects (C4) connecting an integrated circuit (IC) chip to a substrate. Alternatively, the packaging fill material may include overmold material over or between IC chips and/or about wire bond connections, e.g., in flip chip or wire bond applications. The packaging fill material includes a base material, and a plurality of frangible capsules distributed in the base material. Each frangible capsule includes a liquid penetrant contrast agent therein having a different radiopacity than the base material, e.g., an epoxy-based plastic. In response to a crack forming in the packaging fill material, at least one of the plurality of frangible capsules opens, releasing the liquid penetrant contrast agent into the crack. Cracks at least partially filled with the liquid penetrant contrast agent can be more readily identified in an IC package including the packaging fill material. The liquid penetrant contrast agent may have a radiopacity that is higher than the base material. Inspection can be carried out using electromagnetic analysis using visual inspection or digital analysis of the results to more easily identify cracks.

FIG. 1 shows a cross-sectional side view of an integrated circuit (IC) chip package 100 in which embodiments of the disclosure can be employed. IC chip package 100 includes a substrate 102. Substrate 102 may include a plurality of wires 104 therein. IC chip package 100 also includes an IC chip 110, e.g., any form of microprocessor, operatively positioned on substrate 102. Substrate 102 can include any form of circuitized substrate or printed circuit board or another IC chip (see FIG. 8), upon which IC chip 110 is positioned. Substrate 102 can be a final, outermost circuitized substrate or an interposer substrate between IC chip 110 and the final, outermost circuitized substrate. IC chip package 100 also includes a plurality of electrical connections 112 electrically coupling IC chip 110 to substrate 102. For purposes of most of the description, packaging fill material 120 will be described as an underfill material 122. In this case, electrical connections 112 may include any now known or later developed solder ball or controlled collapse chip connect (C4) joints between pads (not shown in FIG. 1) on IC chip 110 and pads (not shown in FIG. 1) on substrate 102. Collectively, the solder connections can create a ball grid array (BGA) 114. This type of electrical connection need not be described further. A distance D between IC chip 110 and substrate 102 may be, for example, approximately 50-150 microns.

Figure 7:
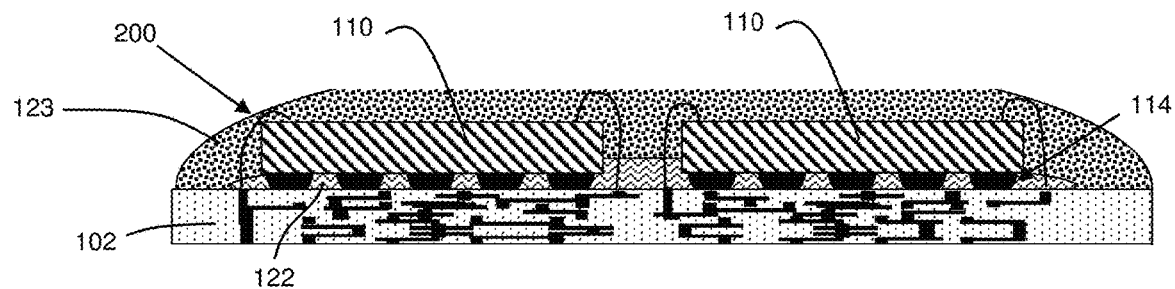
FIG. 7 shows a cross-sectional view of an integrated circuit (IC) chip package including a packaging fill material in the form of an overmold material, according to embodiments of the disclosure.

IC chip package 100 may also include a packaging fill material 120 surrounding electrical connections 112. In the example illustrated in FIG. 1, packaging fill material 120 is disposed between IC chip 110 and substrate 102, and surrounds the solder connections. Here, packaging fill material 120 is provided in the form of an underfill material 122 only between IC chip 110 and substrate 102. It is appreciated by those with skill in the art, as illustrated in FIG. 7, that in some cases packaging fill material 120 may also be provided as overmold material 123 that encapsulates IC chip 110, and can be applied over chips or between chips 110, and may be used to encapsulate electrical connections 212, e.g., wire bonds or other connections in flip chip applications.

Figure 2:
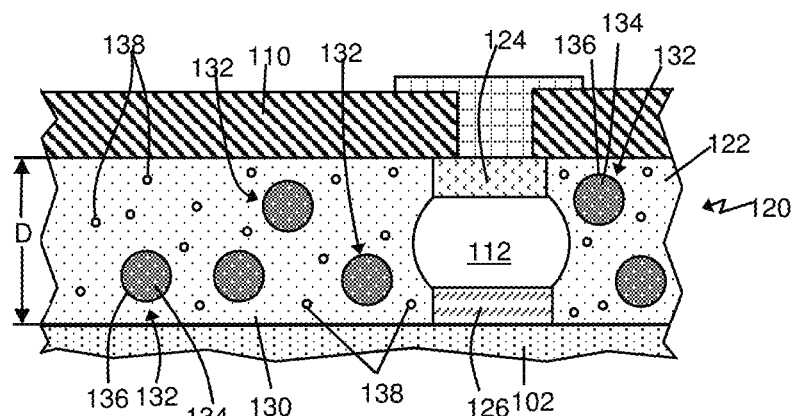
FIG. 2 shows an enlarged cross-sectional view of the IC chip package including a packaging fill material, according to embodiments of the disclosure.
Figure 3:
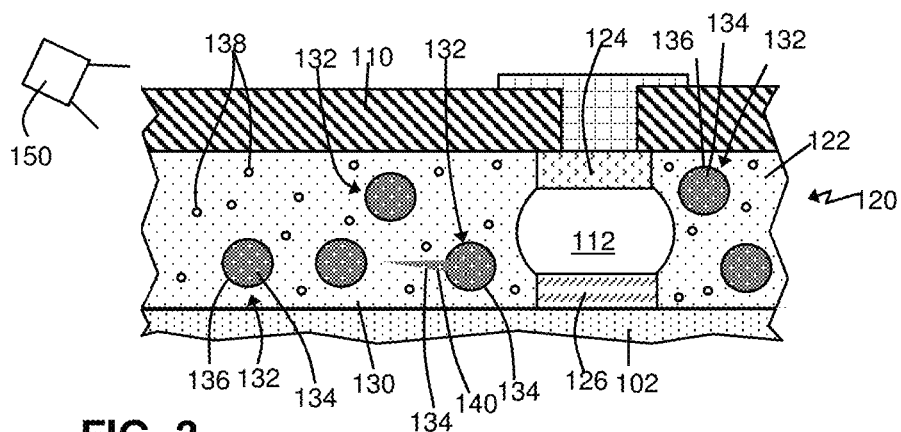
FIG. 3 shows an enlarged cross-sectional view of the IC chip package including a packaging fill material and a crack at least partially filled with a liquid penetrant contrast agent, according to embodiments of the disclosure.
Figure 4:
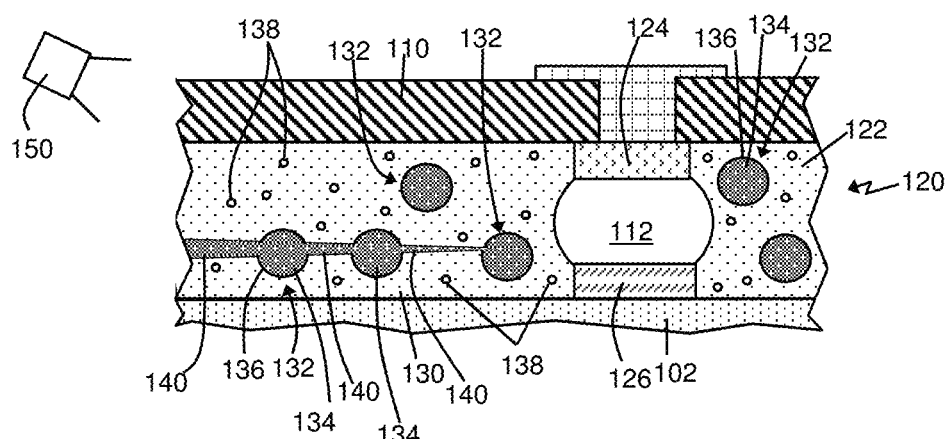
FIG. 4 shows an enlarged cross-sectional view of the IC chip package including the packaging fill material and the crack at least partially filled with the liquid penetrant contrast agent, according to other embodiments of the disclosure.

Referring to the enlarged cross-sectional views of FIGS. 2-4, electrical connections 112 and packaging fill material 120 are shown in greater detail. Electrical connections 112 may extend between pads 124 on IC chip 110 and pads 126 on substrate 102. In accordance with embodiments of the disclosure, packaging fill material 120 includes a base material 130 having a plurality of frangible capsules 132 distributed therein. Base material 130 may include any now known or later developed material for electrical package underfill such as, but not limited to, a plastic, such as a glass, alumina or silica bead or particle 138 filled epoxy. Hence, base material 130 may include a plastic surrounding frangible capsules 132.

Each frangible capsule 132 has a liquid penetrant contrast agent 134 therein having a different radiopacity than base material 130. Frangible capsules 132 include a rupturable shell 136 encapsulating liquid penetrant contrast agent 134. Rupturable shell 136 material may be polymer, for example, urea-formaldehyde or polystyrene, or a glass. In the latter case, rupturable shell 136 may include a hollow glass or polymer sphere, sometimes referred to as a microsphere. In any event, rupturable shell 136 material is sufficiently strong to hold contrast agent 134 under typical environmental conditions, but openable (rupturable) responsive to encountering a crack 140 (FIG. 3) in packaging fill material 120. Upon opening, contrast agent 134 flows from frangible capsule 132 and at least partially fills crack 140. That is, in response to a crack 140 forming in packaging fill material 120, at least one of plurality of frangible capsules 132 opens, releasing liquid penetrant contrast agent 134 into the crack. As shown in FIG. 3, crack 140 may encounter one frangible capsule 132, or as shown in FIG. 4, may propagate through packaging fill material 120 and open a number of frangible capsules 132. Frangible capsules 132 may have a diameter of, for example, 1-20% of distance D. In one example, frangible capsules 132 may be less than about 10, and preferably about 5 or less, microns in diameter. In one non-limiting example, frangible capsules 132 may comprise from about 5% to about 20%, and more preferably about 10%, by weight of packaging fill material 120. However, frangible capsules 132 could comprise up to 90% by weight of underfill if other filler materials are significantly replaced. Frangible capsules 132 may be distributed more evenly throughout the base material using any now known or later developed techniques such as but not limited to: mechanical distribution, e.g., stirring, and chemical distribution, e.g., surfactants.

Liquid penetrant contrast agent 134 (hereafter "contrast agent 134") may include any liquid capable of penetrating crack 140 and having a different radiopacity than base material 130. Radiopacity indicates a material's opaqueness to radiation, and hence, the material's visibility in X-ray images and fluoroscopy. Contrast agent 134 having a different radiopacity from base material 130 enables crack 140 filled with contrast agent 134 to be more readily identifiable from electromagnetic analysis such as X-ray tomography. In one embodiment, contrast agent 134 has a higher radiopacity than at least base material 130. Contrast agent 134 may include any liquid providing the different radiopacity. In non-limiting examples, contrast agent 134 may include at least one of: iodine, iron, titanium, tungsten, barium, cerium, zirconium and their compounds, such as oxides and sulfides. Other contrast agents 134 may include silver nitrate and barium sulfate. In one embodiment, the additive selected would have a radiopacity greater than 10,000 on the Hounsfield scale, e.g., silver=+17,000.

FIG. 7 shows a cross-sectional view of an IC chip package 200 including a packaging fill material 120 in the form of an overmold material 123, according to other embodiments of the disclosure. IC chip package 200 includes substrate 102 including plurality of wires 104 therein. IC chip package 100 also includes IC chips 110, e.g., any form of microprocessor, operatively positioned on substrate 102. Substrate 102 can include any form of circuitized substrate or printed circuit board, upon which IC chip 110 is positioned. Substrate 102 can be a final, outermost circuitized substrate or an interposer substrate between IC chip 110 and the final, outermost circuitized substrate. IC chip package 200 also includes a plurality of electrical connections 212 electrically coupling IC chip 110 to substrate 102. In this example, packaging fill material 120 also includes overmold material 123. As understood in the art, overmold material 123 can be positioned over or between IC chips 110, and may encapsulate electrical connections 212. In this case, electrical connections 212 may include any now known or later developed wiring from a top IC chips 110 to substrate 102. This type of electrical connection need not be described further.

Figure 8:
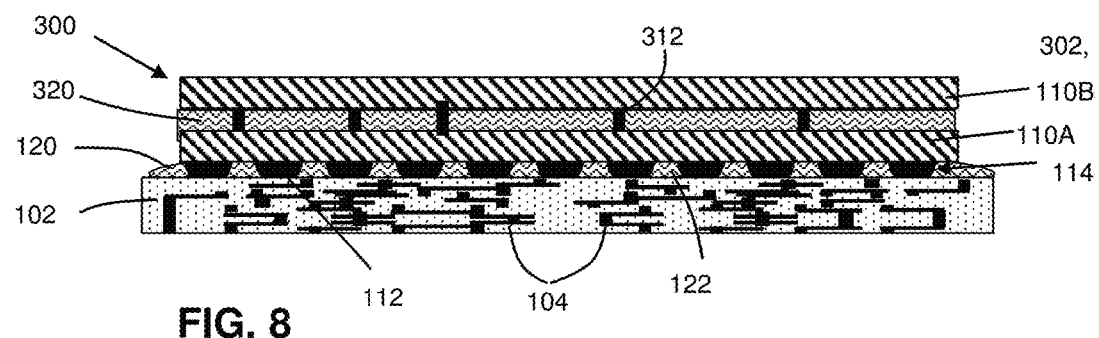
FIG. 8 shows a cross-sectional view of an integrated circuit (IC) chip package including a packaging fill material in the form of between IC chips fill material, according to embodiments of the disclosure.

FIG. 8 shows a cross-sectional view of an IC chip package 300 including a packaging fill material 320 between IC chips 110A, 110B, according to other embodiments of the disclosure. In this example, IC chip package 300 may include substrate 102 coupled to IC chip 110A using packaging fill material 120, as described herein relative to FIG. 1. In addition, IC chip package 300 may also include IC chip 110A between substrate 102 and a substrate 302, where substrate 302 is in the form of another IC chip 110B. In this example, IC chip package 300 also includes a plurality of electrical connections 312 electrically coupling IC chip 110A to substrate 302/IC chip 110B. Electrical connections 312 can include any now known or later developed connection to couple IC chips 110A, 110B, e.g., vias extending through packaging fill material 320, according to embodiments of the disclosure. In this example, packaging fill material 320 surrounds electrical connections 312.

A method according to embodiments of the disclosure may include establishing a coupling of IC chip(s) 110 to substrate 102 using a plurality of electrical connections 112 and/or 212. This step may be carried out using any now known or later developed technique, e.g., ball grid array (BGA) connections, flip chip BGA, wire bond, forming substrate 102 on IC chip 110 using semiconductor processing, etc. As noted, substrate 102 may include a plurality of wires 104 therein, which typically allow scaling of wiring from IC chip 110. With regard to underfill material 122, a space (denoted by distance D in FIG. 1) about plurality of electrical (solder) connections 112 and between IC chip 110 and substrate 102 is then filled with packaging fill material 120. With regard to overmold material 123, a space about or between IC chip(s) 110 may have filled with packaging fill material 120, perhaps encapsulating electrical connections 212, where present. (A lid or heat sink, not shown, could also be added). Packaging fill material 120 includes base material 130 having a plurality of frangible capsules 132, e.g., hollow glass or polymer spheres, distributed therein. Each frangible capsule 132 includes contrast agent 134 therein having a different radiopacity than base material 130. In one example, contrast agent 134 may have a higher radiopacity than at least base material 130 in packaging fill material 120. Contrast agent 134 may include, for example, at least one of: iodine, iron, titanium, tungsten, barium, cerium, zirconium and their compounds, and silver nitrate. As noted, in one example, packaging fill material 120 includes a plastic surrounding plurality of frangible capsules 132. Packaging fill material 120 and, more particularly, base material 130 may further include a plurality of beads or particles 138 of at least one of silica, alumina, and glass, distributed therein. As shown in FIG. 3, in response to crack 140 forming in packaging fill material 120, at least one of plurality of frangible capsules 132 opens, i.e., ruptures, releasing agent 134 into crack 140. It is noted that FIGS. 3 and 4 show exaggerated crack sizes to allow illustration of the penetration of contrast agent 134 into crack 140. FIG. 3 shows crack 140 opening one frangible capsule 132, and FIG. 4 shows crack 140 opening more than one frangible capsule 132. Similar cracking may occur relative to overmold material 123 in FIG. 7. In any event, contrast agent 134 at least partially fills crack 140, changing the radiopacity of the crack compared to at least base material 130. It is noted that where liquid penetrant contrast agent 134 reaches an outer surface of base material 130, i.e., via a surface breaching crack, it may dry. In this case, the efficacy of the contrast agent is not lost.

FIGS. 3 and 4 also show performing an analysis of packaging fill material 120 using an electromagnetic inspection 150 of packaging fill material 120 to identify crack 140 by the contrast of contrast agent 134 compared to at least base material 130 in packaging fill material 120. Electromagnetic inspection 150 may include any now known or later developed X-ray tomography process such as but not limited to X-ray imaging, X-ray computed tomography (CT), etc. The analysis may include at least one of: visually inspecting results of the electromagnetic inspection to identify any cracks 140, and digitally analyzing results of the electromagnetic inspection to identify any cracks. In terms of the latter technique, any now known or later developed three-dimensional visualization and analysis software solution can be used. One non-limiting example may include using Dragonfly® image processing software available from Object Research System of Montreal, Quebec, Canada. As understood in the field, this type of image processing software can parse data by, for example, contrast intensity and/or feature aspect ratio, automatically. Consequently, the increased contrast created by contrast agent 134 in crack 140 makes analysis easier using such systems. Similar processing can be carried out relative to overmold material 123 (FIG. 7), or IC chip package 300 (FIG. 8).

Figure 5:
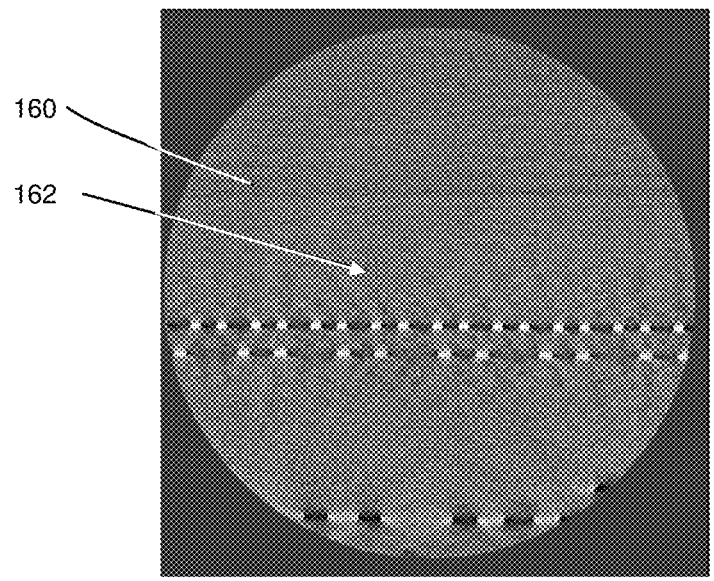
FIG. 5 shows a prior art X-ray computed tomography (CT) image of a packaging fill material including a crack.
Figure 6:
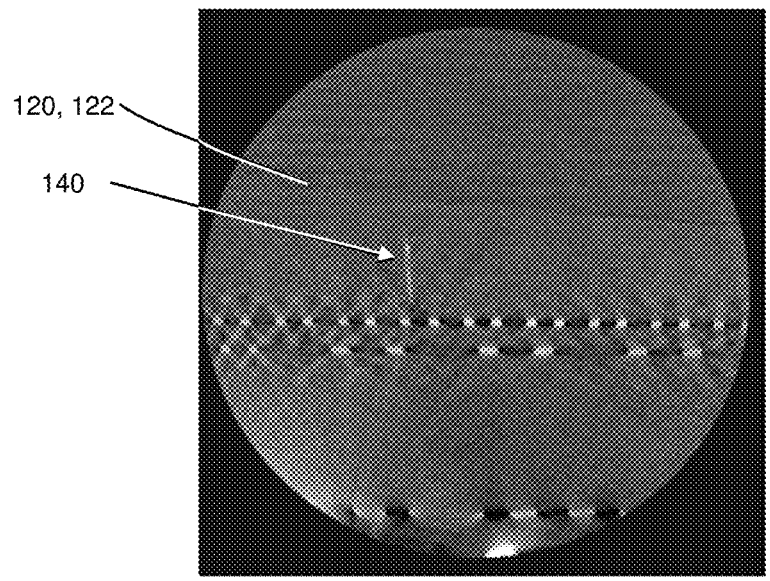
FIG. 6 shows an X-ray CT image of packaging fill material including the crack of FIG. 5 at least partially filled with the liquid penetrant contrast agent, according to embodiments of the disclosure.

To illustrate, FIG. 5 shows a prior art X-ray CT image of a packaging fill material 160 in the form of an underfill material including a crack 162. As illustrated, gas-filled crack 162 is barely visible. Accordingly, identification of crack 162 is very difficult. FIG. 6 shows an X-ray CT image of packaging fill material 120 in the form of underfill material 122 according to embodiments of the disclosure and including a crack 140 (identical location and size as crack 162 in FIG. 5). In FIG. 6, contrast agent 134 has at least partially filled crack 140 making it significantly more visible, i.e., to the naked eye and to any image analysis software. Accordingly, identification of crack 140 is much easier compared to conventional processes.

The method as described above is used in the fabrication of integrated circuit chip packages. The packages may take the form of a single chip package or a multichip package. The end product can be any product that includes integrated circuit chips, ranging from toys and other low-end applications to advanced computer products having a display, a keyboard or other input device, and a central IC chip.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) chip package, comprising:
   a substrate;
   a first IC chip over the substrate;
   a plurality of electrical connections beneath the first IC chip, wherein the plurality of electrical connections electrically couples the first IC chip to a first plurality of wires within the substrate; and
   a packaging fill material between the substrate and the first IC chip, the packaging fill material surrounding the electrical connections, and the packaging fill material including a base material having a plurality of frangible capsules distributed therein, each frangible capsule having a liquid penetrant contrast agent therein having a radiopacity greater than 10,000 on the Hounsfield scale that includes at least one of: iodine, iron, barium, cerium, zirconium and their compounds, and silver nitrate.

2. The IC chip package of claim 1, wherein in response to a crack forming in the packaging fill material, at least one of the plurality of frangible capsules is structured to open and release the liquid penetrant contrast agent into the crack.

3. The IC chip package of claim 1, wherein the packaging fill material further includes a plurality of beads or particles of at least one of silica, alumina, and glass, distributed in the base material.

4. The IC chip package of claim 1, wherein the base material includes a plastic surrounding the plurality of frangible capsules.

5. The IC chip package of claim 1, wherein each frangible capsule includes a hollow glass or polymer sphere.

6. The IC chip package of claim 1, wherein each frangible capsule has a diameter less than about 10 microns.

7. The IC chip package of claim 6, wherein the diameter of each frangible capsule is about 5 microns.

8. The IC chip package of claim 1, wherein the plurality of frangible capsules are about 5% to about 20% by weight of the packaging fill material.

9. The IC chip package of claim 8, wherein the plurality of frangible capsules are about 10% by weight of the packaging fill material.

10. The IC chip package of claim 1, wherein each frangible capsule has a diameter about 1% to about 20% of a distance between the first IC chip and the substrate.

11. The IC chip package of claim 1, further comprising a second IC chip over the first IC chip, wherein a second plurality of electrical connections electrically couples the second IC chip and the first IC chip.

12. A packaging fill material for electrical packaging, the packaging fill material comprising:
    a base material; and
    a plurality of frangible capsules distributed in the base material, each frangible capsule including a liquid penetrant contrast agent therein having a radiopacity greater than 10,000 on the Hounsfield scale that includes at least one of: cerium, and its compounds, and silver nitrate.

13. The packaging fill material of claim 12, further comprising a plurality of beads or particles of at least one of silica, alumina, and glass, distributed in the base material.

14. The packaging fill material of claim 12, wherein the base material includes an epoxy.

* * * * *